(12) United States Patent
Yeh

(10) Patent No.: US 7,708,580 B2
(45) Date of Patent: May 4, 2010

(54) ELECTRICAL CONNECTOR WITH A LOAD PLATE FASTENED TO A PRINTED CIRCUIT BOARD BY SCREWS

(75) Inventor: Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/381,865

(22) Filed: Mar. 17, 2009

(65) Prior Publication Data

US 2009/0233464 A1    Sep. 17, 2009

(30) Foreign Application Priority Data

Mar. 17, 2008    (TW)    ............... 97204539 U
Mar. 17, 2008    (TW)    ............... 97204540 U

(51) Int. Cl.
*H01R 13/62*    (2006.01)
(52) U.S. Cl. .................................................... 439/331
(58) Field of Classification Search ................. 439/331, 439/330, 157
See application file for complete search history.

(56) References Cited

U.S. PATENT DOCUMENTS

| 5,761,036 | A | 6/1998 | Hopfer et al. | |
| 7,125,274 | B1 * | 10/2006 | Ju et al. | 439/342 |
| 7,473,121 | B2 * | 1/2009 | Fan et al. | 439/342 |
| 7,588,452 | B2 * | 9/2009 | Yeh | 439/331 |
| 2008/0124955 | A1 * | 5/2008 | Szu | 439/78 |

* cited by examiner

*Primary Examiner*—Chandrika Prasad
(74) *Attorney, Agent, or Firm*—Andrew C. Cheng; Wei Te Chung; Ming Chieh Chang

(57) ABSTRACT

An electrical connector (1) mounted to a printed circuit board (7) for receiving an IC package includes a substantially rectangular insulative housing (2) mounted to the printed circuit board (7), a plurality of contacts (3) received in the insulative housing (2), a retention member (5) mounted to the printed circuit board (7) by a pair of fasteners (6) and separated from the insulative housing (2), and a load plate (4) pivotally mounted to the retention member (5) and capable of moving between a closed position and an open position. The load plate (4) has at least one section able to engage with the fasteners (6) so that the load plate (4) is constrained when rotating relative to the retention member (5).

18 Claims, 7 Drawing Sheets

ELECTRICAL CONNECTOR WITH A LOAD PLATE FASTENED TO A PRINTED CIRCUIT BOARD BY SCREWS

FIELD OF THE INVENTION

The present invention relates to an electrical connector, and more particularly to an electrical connector mounted to a printed circuit board for receiving an IC package.

DESCRIPTION OF PRIOR ART

Electrical connectors are widely used in the electronic transmitting field to interconnect two separate electronic components, i.e. an IC package and a motherboard, so as to establish electrical connection therebetween. The electrical connector basically includes an insulative housing, a plurality of electrical contacts received in the insulative housing for contacting the leads or terminals of the IC package. Additional, the electrical connector generally needs a fastening device to lock the IC package in a closed position.

U.S. Pat. No. 7,278,860 issued to Hao-Yun Ma on Oct. 9, 2007 discloses an electrical connector mounted to a printed circuit board for connecting an IC package. The electrical connector includes an insulative housing with a number of contacts received therein, a metal stiffener surrounding the insulative housing with one end pivotally connecting a load lever and an opposite end connecting a load plate. After the IC package is loaded onto the housing, the load plate rotates toward the IC package and presses it, and then the load lever rotates toward the load plate and locks the load plate, such that the IC package is reliably retained in the electrical connector.

In Hao-Yun Ma, however, utilizing a stiffener of metal which located at the whole periphery of the housing to mount the load lever and the load plate is not economic and is not profitable for saving space on the printed circuit board.

U.S. Pat. No. 7,234,955 issued to Chien-Chih Ho on Jun. 26, 2007 discloses another electrical connector for mounting an IC package. This type of electrical connector includes an insulative housing with a number of contacts received therein. A load plate and a load lever are respectively mounted to opposite ends of the housing by a pair of metal fasteners, which are positioned at the opposite ends of the housing to engage the load lever and the load plate, respectively, so that the load lever and the load plate are able to rotate relative to the housing.

Though Chien-Chih doesn't utilize a metal stiffener of high cost to mount the load lever and the load plate, the substituted fasteners that attach to the housing make the housing essentially be formed with corresponding retaining sections to retain such fasteners and thereby make the structure of the housing complicated and not easy to be molded.

Thus, there is a need to provide a new electrical connector that overcomes the above-mentioned problems.

SUMMARY OF THE INVENTION

It is therefore the object of the present invention to provide an electrical connector capable of saving space on the printed circuit board and also reducing the cost.

In accordance with the present invention, an electrical connector mounted to a printed circuit board for receiving an IC package includes a substantially rectangular insulative housing mounted to the printed circuit board, a plurality of contacts received in the insulative housing, a retention member mounted to the printed circuit board by a pair of fasteners and separated from the insulative housing, and a load plate pivotally mounted to the retention member and capable of moving between a closed position and an open position. The load plate has at least one section able to engage with the fasteners so that the load plate is constrained when rotating relative to the retention member.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
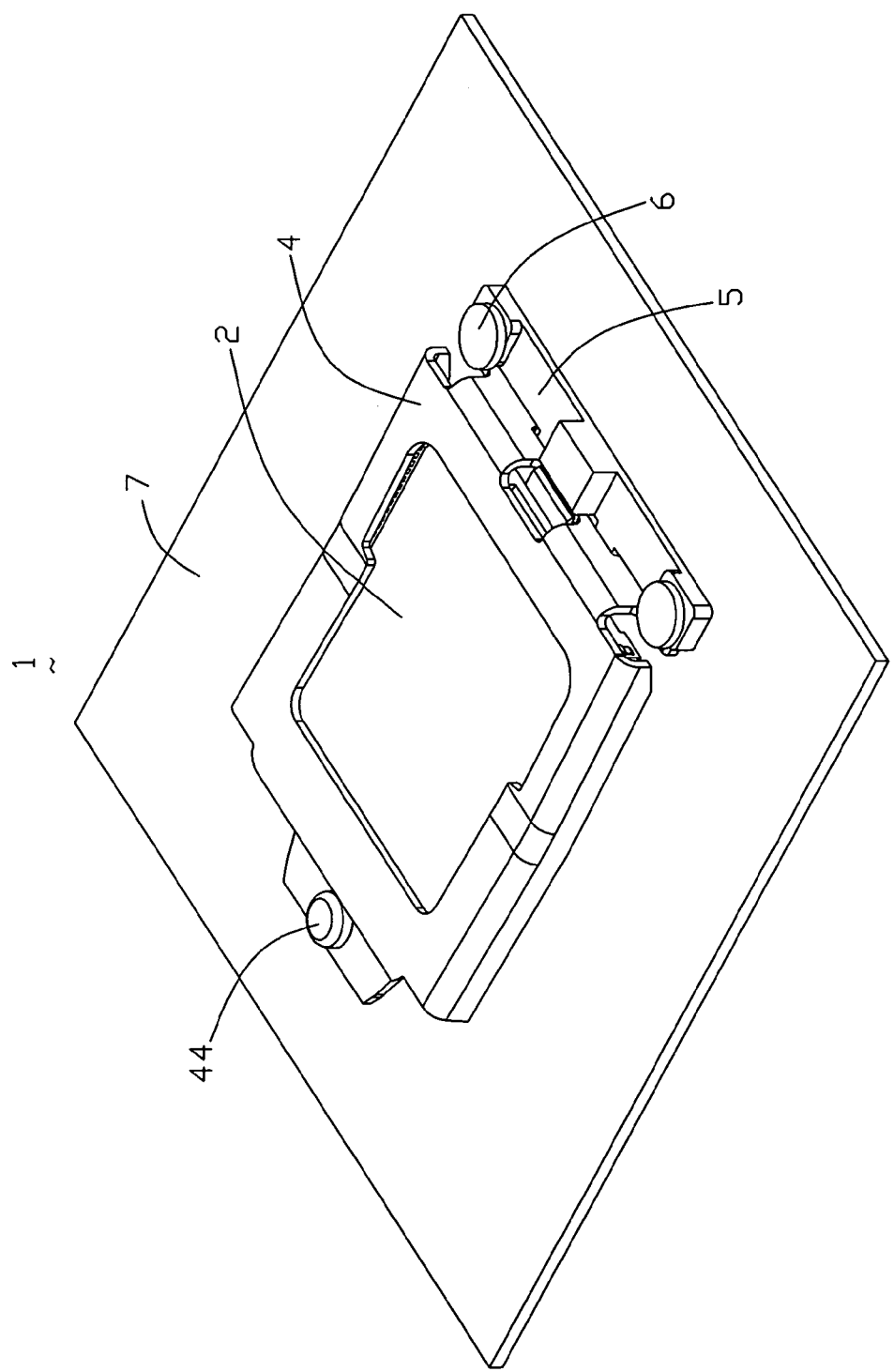
FIG. 1 is an assembled, perspective view of an electrical connector in accordance with a preferred embodiment of the present invention, in which a load plate is in a closed position.
Figure 2:
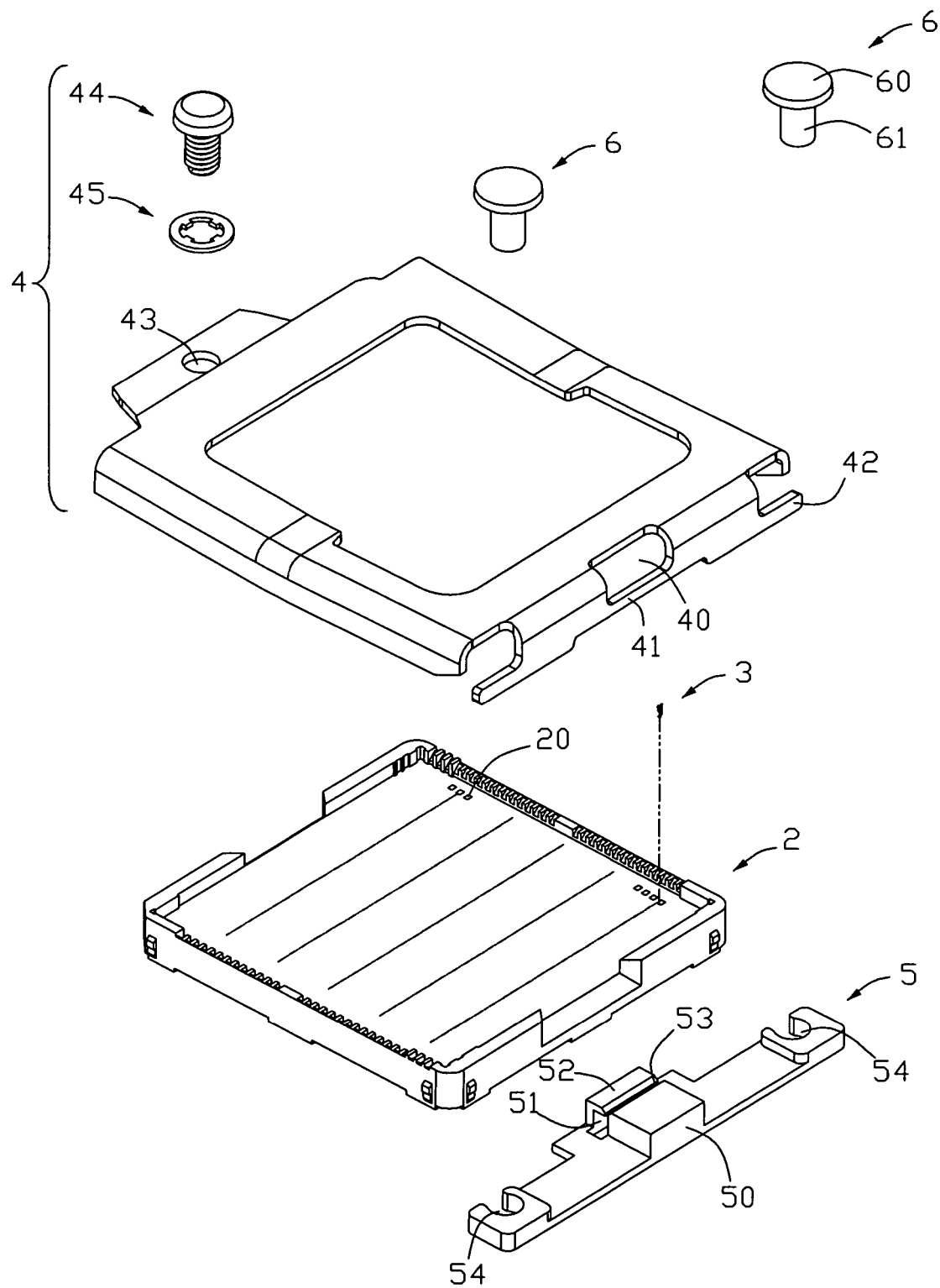
FIG. 2 is an exploded, perspective view of the electrical connector shown in FIG. 1.
Figure 3:
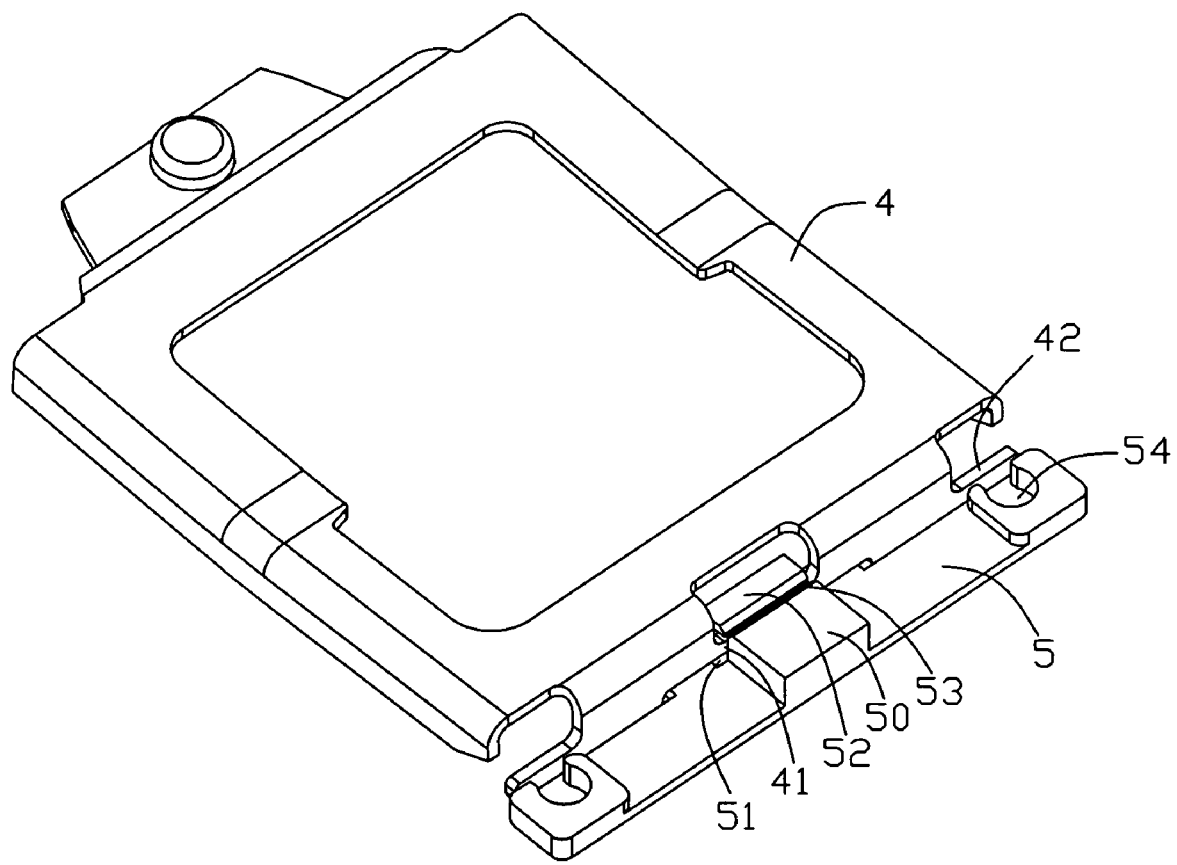
FIG. 3 is an assembled, perspective view of a load plate and a retention member of the electrical connector shown in FIG. 1.

Referring to FIGS. 1-3, an electrical connector 1 in accordance with a preferred embodiment of the present invention is generally mounted to a printed circuit board 7 to receive an IC package (not shown). The electrical connector 1 includes a substantially rectangular insulative housing 2 mounted to the printed circuit board 7 and having a plurality of passageways 20 for receiving a plurality of contacts 3 therein, and a retention member 5 mounted to the printed circuit board 7 and located adjacent the insulative housing 2 to mount a load plate 4 which is capable of rotating relative to the insulative housing 2 between a closed position and an open position.

The load plate 4 is made from a metal plate and configured with a substantially rectangular shape. The load plate 4 has one edge (not labeled) connected to the retention member 5 and bent downward, whereby an opening 40 and a pivot section 41 are formed at a middle position of that edge. A pair of stopped section 42 are extending from two opposite sides of pivot section 41. Another end of the load plate 4 opposite to the retention member 5 is provided with a securing hole 43, by which a latching member 44 is attached to the load plate 4 and is able to lock the load plate 4 to the closed position. In addition, a gasket 45 is disposed between the securing hole 43 and the latching member 44.

Figure 4:
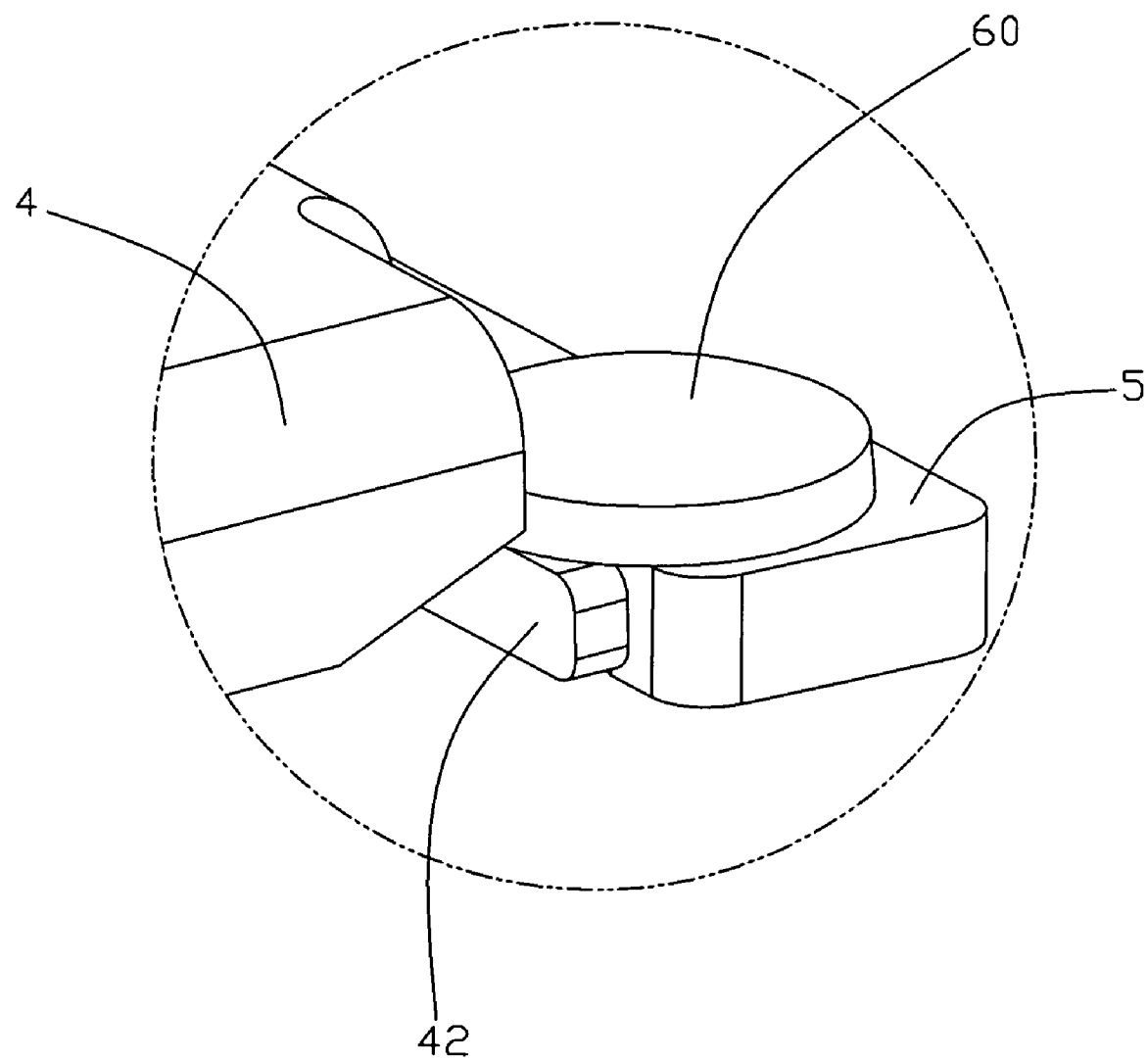
FIG. 4 is a partial perspective view of the electrical connector shown in FIG. 1.

Referring to FIGS. 2-4, the plastic retention member 5 is configured with a substantial elongate shape and mounted to the printed circuit board 7 by a pair of fasteners 6. The retention member 5 is independently formed without engagement with the insulative housing 2 and located adjacent only one side of the insulative housing 2. At the middle of the retention member 5, an elevated section 50 is formed and further includes a slot 51 for receiving the pivot section 41, a slit 53 allowing the pivot section 41 to get into the slot 51 and a covering section 52 above the slot 51 to prevent the pivot section 41 from moving away from the slot 51. The retention member 5 further has a pair of retaining holes 54 at opposite ends thereof to receive the fasteners 6. The retaining hole 54 is semi-closed with an opening (not labeled) blocked by the stopped section 42. The fastener 6 includes a head portion 60 and a column 61. The stopped section 42 is movably located under the head portion 60 of the fastener 6 so that the movement of the load plate 4 should be constrained, and then the fastener 6 enables the load plate 4 to stably positioned in the open position.

Since the retention member 5 is employed in the electrical connector 1 of the present invention to replace the conventional metal stiffener of frame configuration, the electrical connector 1 is able to efficiently save space on the printed circuit board 7 and also achieve low-cost design.

Figure 5:
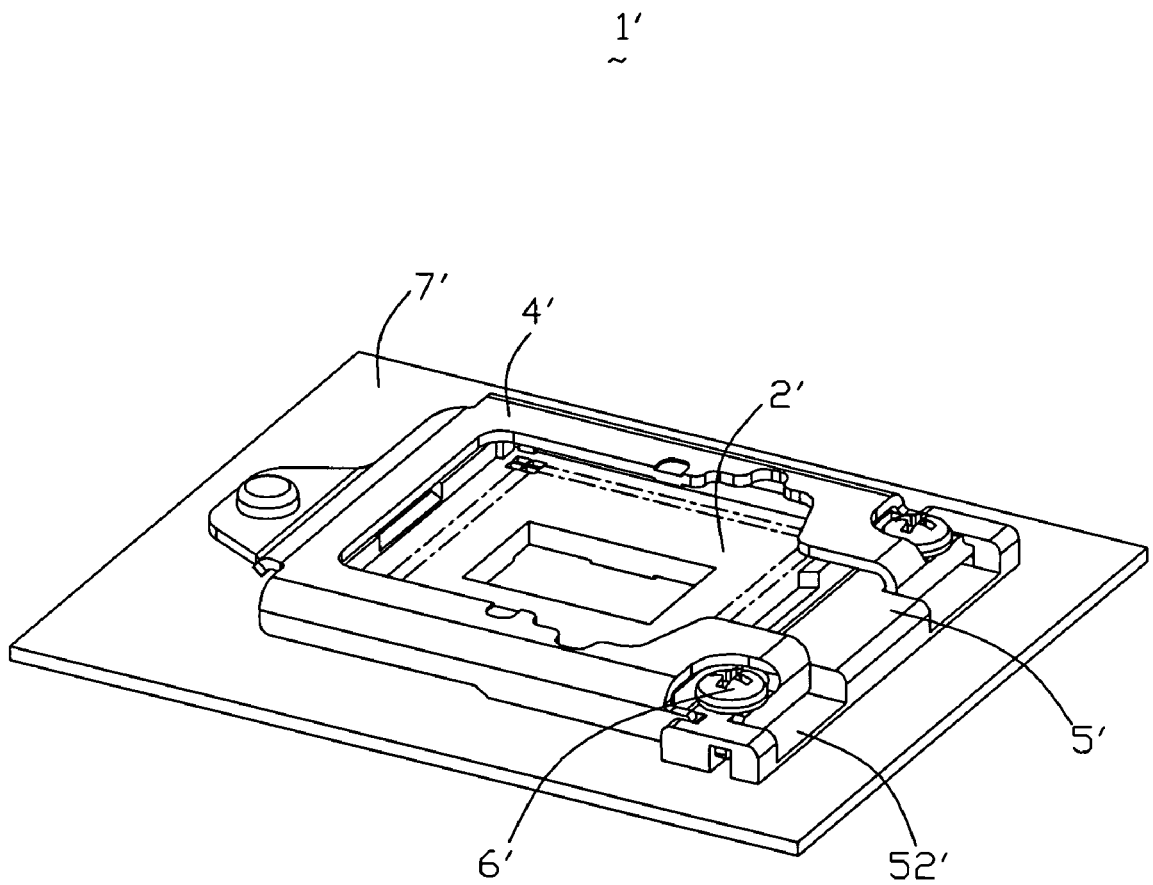
FIG. 5 is an assembled, perspective view of an electrical connector in accordance with a second embodiment of the present invention, in which a load plate is in a closed position.
Figure 6:
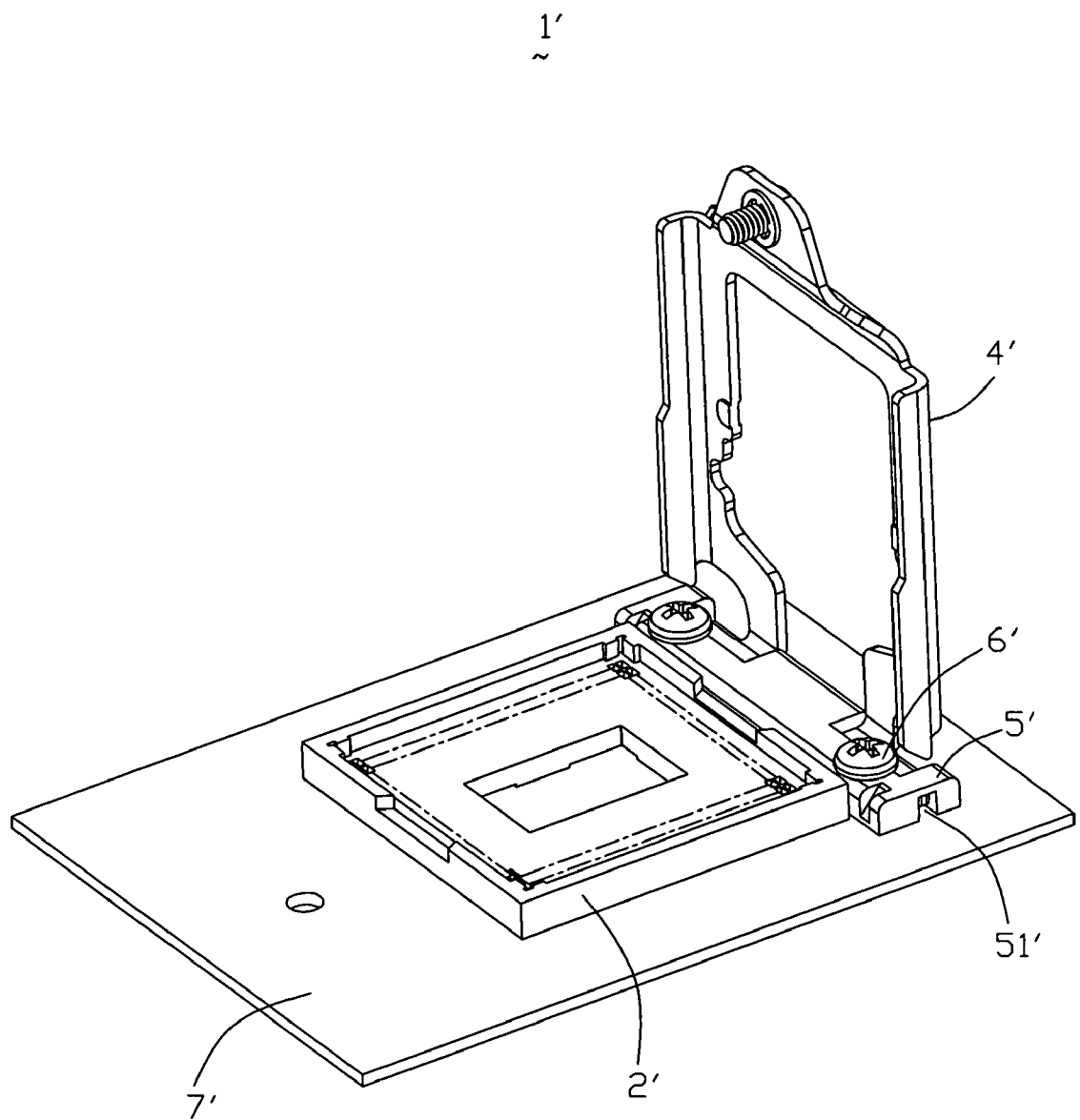
FIG. 6 is an assembled, perspective view of an electrical connector shown in FIG. 5.
Figure 7:
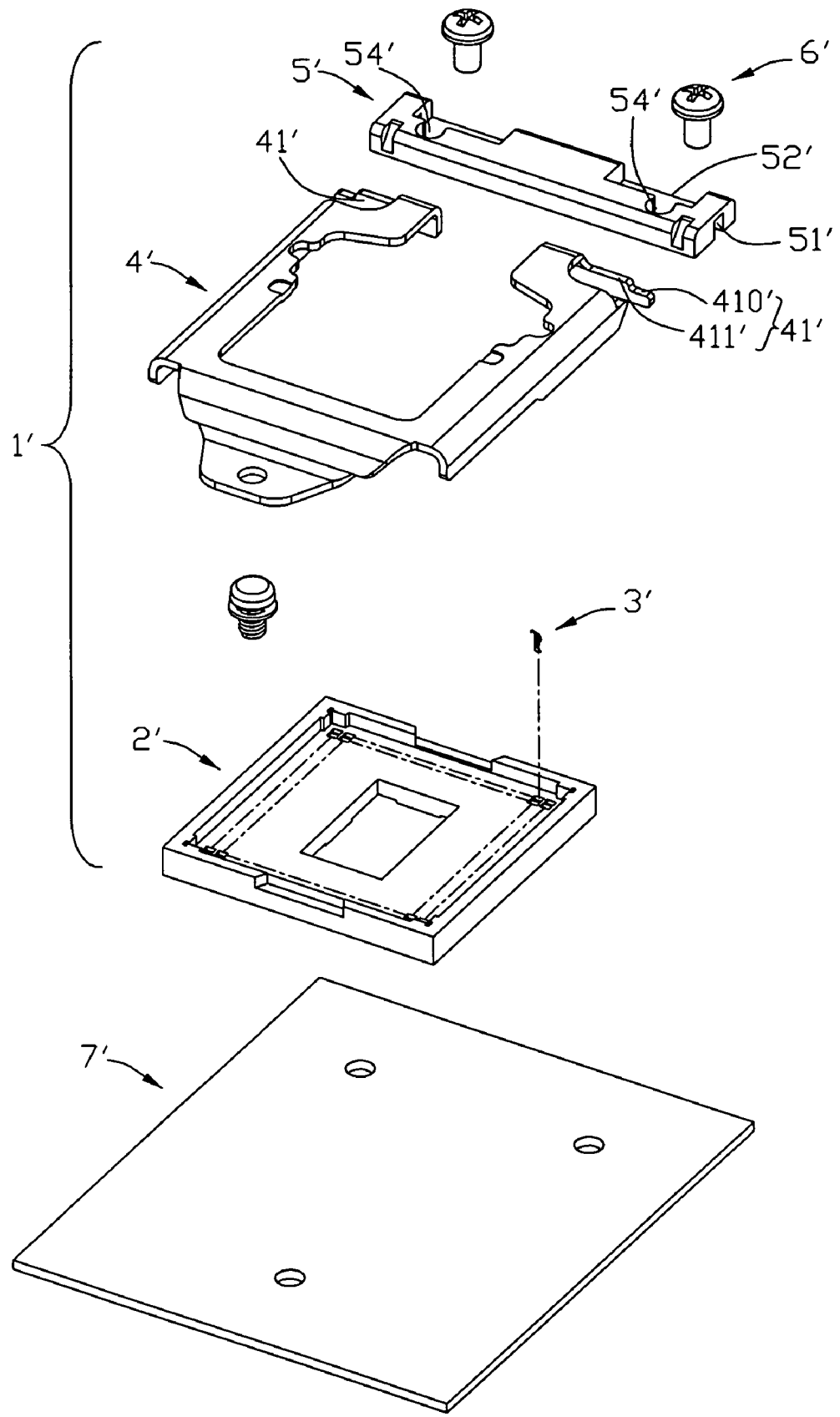
FIG. 7 is an exploded, perspective view of the electrical connector shown in FIG. 5.

FIGS. 5-7 shows an electrical connector 1' of the second embodiment of the present invention that has a similar structure to the first preferred embodiment as described above and will be described hereafter for short. The electrical connector 1' includes a substantially rectangular insulative housing 2' mounted to a printed circuit board 7' and having a plurality of contacts 3' received therein, and a retention member 5' mounted to the printed circuit board 7' by a pair of fasteners 6' and located adjacent the insulative housing 2' to mount a load plate 4' which is capable of rotating relative to the insulative housing 2' between a closed position and an open position.

The retention member 5' is configured with an elongate shape and has a pair of slots 51' at two ends thereof and a pair of retaining holes 54' for receiving the fasteners 6'. The load plate 4' has a pair of pivot sections 41' extending into the slots 51' to allow the load plate 4' to pivotally move relative to the retention member 5'. The pivot sections 41' are spaced from each other with a gap (not labeled) therebetween and are thereby able to elastically move a small distance toward each other so as to allow the load plate 4' to be mounted to the retention member 5'. The pivot section 41' further includes a narrower portion 410' received in the slot 51' and a wider portion 411' stopped out of the slot 51'. The wider portion 411' is movably under a head portion 60' of the fastener 6' to engage with the fastener 6' and be constrained by head portion 60' during rotation so that the narrower portion 410' is ensured to freely rotate in the slot 51' without substantial friction with inner walls (not labeled) of the slot 51'. A pair of supporting surfaces 52' are provided on the retention member 5' for supporting the wider portion 411' and then stopping the load plate 4' at the open position.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector mounted to a printed circuit board for receiving an IC package comprising:
   a substantially rectangular insulative housing mounted to the printed circuit board;
   a plurality of contacts received in the insulative housing;
   a retention member mounted to the printed circuit board by a pair of fasteners and separated from the insulative housing; and
   a load plate pivotally mounted to the retention member and capable of moving between a closed position and an open position, the load plate having at least one section able to engage with the fasteners so that the load plate is constrained when rotating relative to the retention member wherein the load plate is provided with a latching member at an end opposite to the retention member, the latching member being screwed into the printed circuit board to lock the load plate in the closed position.

2. The electrical connector as claimed in claim 1, wherein the retention member is made of plastic and located at only one side of the insulative housing without engagement with the insulative housing.

3. The electrical connector as claimed in claim 1, wherein the load plate has a pivot section at a middle position of one edge of the load plate, and the retention member correspondingly has a slot for receiving the pivot section.

4. The electrical connector as claimed in claim 3, wherein the retention member is configured with an elongate shape and has a pair of retaining holes for receiving the fasteners, and the load plate has a pair of stopped sections at opposite sides of the pivot section, the stopped portion being movably under a head portion of the fastener and stopped by the head portion so as to ensure the load plate to be reliably stopped at the open position.

5. The electrical connector as claimed in claim 4, wherein the retaining hole is semi-closed with an opening blocked by the stopped section.

6. The electrical connector as claimed in claim 5, wherein the slot is formed from an elevated section of the retention member, the elevated section further including a slit allowing the pivot section to get into the slot and a covering section above the slot to prevent the pivot section from moving away from the slot.

7. The electrical connector as claimed in claim 1, wherein the retention member is configured with an elongate shape and has a pair of slots at two ends thereof and a pair of retaining holes for receiving the fasteners, and the load plate has a pair of pivot sections extending into the slots to allow the load plate to pivotally move relative to the retention member.

8. The electrical connector as claimed in claim 7, wherein the pivot sections are spaced from each other with a gap therebetween and are thereby able to elastically move a small distance toward each other so as to allow the load plate to be mounted to the retention member.

9. The electrical connector as claimed in claim 7, wherein the pivot section includes a narrower portion received in the slot and a wider portion stopped out of the slot, the wider portion being dimensioned sufficiently to be located under a head portion of the fastener and constrained by the fastener during rotation and so that the narrower portion is ensured to freely rotate in the slot without substantial friction with the slot.

10. The electrical connector as claimed in claim 7, wherein a pair of supporting surfaces are provided on the retention member for supporting the pivot section and then stopping the load plate at the open position.

11. An electrical connector mounted to a printed circuit board for receiving an IC package comprising:
   an insulative housing mounted to the printed circuit board and defining a four-sided structure;
   a plurality of contacts received in the insulative housing;
   a retention member of elongate configuration mounted to the printed circuit board and located adjacent only one side of the insulative housing with the other three sides of the insulative housing without being shielded by the retention member; and
   a load plate pivotally mounted to the retention member and capable of moving between a closed position and an open position wherein the load plate is provided with a latching member at an end opposite to the retention member, the latching member being screwed into the printed circuit board to lock the load plate in the closed position.

12. The electrical connector as claimed in claim 11, wherein the retention member is mounted to the printed circuit board by a pair of fasteners capable of constraining the movement of the load plate.

13. The electrical connector as claimed in claim 12, wherein the loading plate has one edge formed with a pivot section at a middle position thereof and a pair of stopped section at opposite ends thereof, and the retention member correspondingly has a slot for receiving the pivot section and two retaining holes for receiving the fasteners, the stopped section being movably under a head portion of the fasteners.

14. The electrical connector as claimed in claim 11, wherein the retention member is configured with an elongate shape and has a pair of slots at two ends thereof and a pair of retaining holes for receiving the fasteners, and the load plate has a pair of pivot sections extending into the slots to allow the load plate to pivotally move relative to the retention member.

15. The electrical connector as claimed in claim 14, wherein the pivot sections are spaced from each other with a gap therebetween and are thereby able to elastically move a small distance toward each other so as to allow the load plate to be mounted to the retention member.

16. The electrical connector as claimed in claim 15, wherein the pivot section includes a narrower portion received in the slot and a wider portion stopped out of the slot, the wider portion being dimensioned sufficiently to be located under a head portion of the fastener and constrained by the fastener during rotation so that the narrower portion is ensured to freely rotate in the slot without substantial friction with the slot.

17. The electrical connector as claimed in claim 16, wherein a pair of supporting surfaces are provided on the retention member for supporting the pivot section and then stopping the load plate at the open position.

18. An electrical connector assembly comprising:
a printed circuit board;
an insulative housing mounted upon the printed circuit board and defining opposite first and second ends along a longitudinal direction;
a plurality of contacts disposed in the housing with contacting sections extending above a top face of the housing;
a retention member located proximate the second end;
a load plate positioned intimately above the housing and having opposite first and second end regions, wherein
the first end region is fastened to the printed circuit board around the first end in a face to face abutment by screwing a first fastener for reliable securement thereof, while the second end region is fastened to the retention member in an edge to face abutment against a second fastener so as to allow rotation of the load plate about the second end region once the first end region is released from said first fastener.

* * * * *